(12) United States Patent
Werle et al.

(10) Patent No.: US 8,487,637 B2
(45) Date of Patent: *Jul. 16, 2013

(54) TEST ARRANGEMENT FOR IMPULSE VOLTAGE TESTING OF ELECTRICAL HIGH-VOLTAGE COMPONENTS

(75) Inventors: Peter Werle, Walsrode (DE); Matthias Steiger, Schierau (DE)

(73) Assignee: AGG Technology AG, Zurich (CH)

( * ) Notice: Subject to any disclaimer, the term of this patent is extended or adjusted under 35 U.S.C. 154(b) by 304 days.

This patent is subject to a terminal disclaimer.

(21) Appl. No.: 12/961,988

(22) Filed: Dec. 7, 2010

(65) Prior Publication Data

US 2011/0133754 A1  Jun. 9, 2011

Related U.S. Application Data

(63) Continuation of application No. PCT/EP2009/003976, filed on Jun. 4, 2009.

(30) Foreign Application Priority Data

Jun. 12, 2008 (EP) .................................. 08010755

(51) Int. Cl.
*H01H 31/02* (2006.01)
*G01R 31/02* (2006.01)

(52) U.S. Cl.
CPC .................................... *G01R 31/021* (2013.01)
USPC ........................................................ 324/555

(58) Field of Classification Search
None
See application file for complete search history.

(56) References Cited

U.S. PATENT DOCUMENTS

| | | | |
|---|---|---|---|
| 2,032,904 A | 3/1936 | Bellaschi | |
| 2,237,812 A | 4/1941 | De Blieux | |
| 2,551,841 A | 5/1951 | Kepple et al. | |
| 2,905,891 A * | 9/1959 | Duenke et al. | ................ 324/547 |
| 4,367,512 A | 1/1983 | Fujita | |
| 4,427,898 A | 1/1984 | Miyake et al. | |

(Continued)

FOREIGN PATENT DOCUMENTS

| | | |
|---|---|---|
| AT | 330 887 | 7/1976 |
| AT | 330 887 B | 7/1976 |

(Continued)

OTHER PUBLICATIONS

International Search Report (PCT/ISA/210) issued on Nov. 4, 2009, by European Patent Office as the International Searching Authority for International Application No. PCT/EP2009/003976.

(Continued)

*Primary Examiner* — Paresh Patel
(74) *Attorney, Agent, or Firm* — Buchanan Ingersoll & Rooney PC

(57) ABSTRACT

Exemplary embodiments are directed to a test arrangement for testing surge voltage in electrical high voltage components with a surge voltage generator and a voltage distributor. The surge voltage generator and voltage distributor have a tower-like structure with a first and a second structure end. A rectangular container is connected to the first and second structure and includes a first and a second container end. At least one of the surge voltage generator and the voltage distributor are movable between a first substantially horizontal position inside the container and a substantially vertical position relative to the container. Each movement between the two positions involves a pivot motion about a rotational axis perpendicular to the longitudinal direction of the surge voltage generator.

16 Claims, 2 Drawing Sheets

U.S. PATENT DOCUMENTS

| | | | |
|---|---|---|---|
| 4,535,253 | A | 8/1985 | Ootsuka et al. |
| 4,829,256 | A * | 5/1989 | Yamagiwa et al. ........... 324/557 |
| 5,845,854 | A | 12/1998 | Adam et al. |
| 6,211,683 | B1 | 4/2001 | Wolf |
| 6,586,697 | B1 | 7/2003 | Enns |
| 7,394,171 | B2 | 7/2008 | Loppacher |

FOREIGN PATENT DOCUMENTS

| | | |
|---|---|---|
| DE | 521 475 | 3/1931 |
| DE | 521 475 C | 3/1931 |
| DE | 1 563 442 | 4/1970 |
| DE | 23 28 375 A1 | 1/1975 |
| DE | 196 39 023 A1 | 3/1998 |
| DE | 20 2009 001 837 U1 | 5/2009 |
| EP | 2 133 704 A1 | 12/2009 |
| JP | 61102176 A | 5/1986 |
| SU | 1179234 | 9/1985 |
| WO | WO 2009/149866 A1 | 12/2009 |

OTHER PUBLICATIONS

International Search Report (PCT/ISA/210) issued on Nov. 3, 2009, by European Patent Office as the International Searching Authority for International Application No. PCT/EP/2009/003756.

European Search Report issued on Nov. 26, 2008 (with English translation of category of cited documents) for Application No. 08010691.

International Search Report (PCT/ISA/210) issued on Nov. 3, 2009, by European Patent Office as the International Searching Authority for International Application No. PCT/EP/2009/003977.

International Search Report (PCT/ISA/210) issued on Oct. 23, 2009, by European Patent Office as the International Searching Authority for International Application No. PCT/EP/2009/004001.

International Search Report (PCT/ISA/210) issued on Nov. 9, 2009, by European Patent Office as the International Searching Authority for International Application No. PCT/EP2009/004048.

A. Winter et al., "A Mobile Transformer Test System Based on a Static Frequency Converter", XVth International Symposium on High Voltage Engineering, Ljubljana, Slovenia, Aug. 27-31, 2007; T10-732; pp. 1-6, XP-002500564.

W. Schufft et al., "Frequency-Tuned Resonant Test Systems for On-Site Testing and Diagnostics of Extruded Cables", High Voltage Engineering Symposium, Aug. 22-27, 1999, vol. 5, No. 467, pp. 335-339, London, UK, XP-006501811.

Alexander Winter et al., "A New Generation of On-Site Test Systems for Power Transformers", IEEE International Symposium on Electrical Insulation, Jun. 9-12, 2008, pp. 478-482, Vancouver, Canada, XP-007906016.

S. Schierig et al., "HV AC Generation Based on Resonant Circuits With Variable Frequency for Testing of Electrical Power Equipment on Site", International Conference on Condition Monitoring and Diagnosis, Beijing, China, Apr. 21-24, 2008, pp. 684-691, Piscataway, U.S., XP-031292593.

T. Grun et al., "Equipment for On-Site Testing of HV Insulation", High Voltage Engineering Symposium, Aug. 22-27, 1999, pp. 240-243, London, UK, XP-006501801.

J. Lopez-Roldan et al., "Mobile Substations: Application, Engineering and Structural Dynamics", IEEE, Jan. 1, 2006, pp. 951-956, Piscataway, NJ, XP-031101946.

Jose Lopez-Roldan et al., "How to Achieve a Rapid Deployment of Mobile Substations and to Guarantee Its Integrity During Transport", IEEE Transactions on Power Delivery, vol. 23, No. 1, Jan. 2008, pp. 196-202, New York, New York, US, XP-011197613.

High Volt: "Tuneable Modular Reactors of High Power, Types DERI . . .M, G", Data Sheet No. 1.22/4, Apr. 1, 2007, pp. 1-3.

Haefely High Voltage Test, "Impulse Voltage Test System SGSA", 2001, pp. 1-18, XP-0091090930.

Klaus Schwenk et al., "Load Range Extension Methods for Lightning Impulse Testing With High Voltage Impulse Generators", 6 pages.

M. Loppacker, "On-Site Impulse Tests and Corresponding State of the Art Measurement and Analysis Techniques for Power Transformers", Haefely High Voltage Test, 1999, 5 pages.

Notice of Opposition filed in corresponding European Patent Application No. 2286254 on May 23, 2012.

Notice of Opposition filed in corresponding European Patent Application No. 213388 filed May 9, 2012.

Eklund et al., "Transformation vor Ort", ABB Technik Apr. 2007, pp. 45-48.

Winter et al., "A Mobile Transformer Test System Based on a Static Frequency Converter", XVth International Symposium on High Voltage Engineering, University of Ljubljana, Ljubljana, Slovenia, Aug. 27-31, 2007, pp. 1-6.

Eklund et al., "Increase transformer reliability and availability: From condition assessment to On-Site Repair", Power-Gen Middle East, Bahrain, 2007, pp. 1-17.

Winter et al., "A New Generation of On-Site Test Systems for Power Transformers", HighVOLT Prüftechnik Dresden GmbH, Dresden, Germany, pp. 478-482.

Data Sheet No. 1.22/2, "Tunable Modular, Reactors of High Power, Types DERI . . . M, G", HIGH VOLT, XP007910187.

Küchler, Prof. Dr.-Ing. Andreas, "Hochspannungstechnik", Springer, Verlag Bern Heidelberg 2005, p. 444.

Dissertation of Dipl-Ing. Florian Martin, "Hochspannungsprüfsystem auf Basis leistungselektronischer Frequenzkonverter", May 20, 2008, pp. 1-188.

Presentation for "Mobile on-site test system for off-line tests and diagnostics at power transformers", ABB, 2006, pp. 1-17.

* cited by examiner

TEST ARRANGEMENT FOR IMPULSE VOLTAGE TESTING OF ELECTRICAL HIGH-VOLTAGE COMPONENTS

RELATED APPLICATIONS

This application claims priority as a continuation application under 35 U.S.C. §120 to PCT/EP2009/003976, which was filed as an International Application on Jun. 4, 2009, designating the U.S., and which claims priority to European Patent Application No. 08010755.0 filed in Europe on Jun. 12, 2008. The entire contents of these applications are hereby incorporated by reference in their entireties.

FIELD

The disclosure relates to an impulse voltage generator, such as a test arrangement for impulse voltage testing of electrical high-voltage components, having an impulse voltage generator and a voltage divider.

BACKGROUND INFORMATION

Impulse voltage generators are used to test high-voltage components, such as power transformers.

An impulse voltage generator can be used to produce a voltage impulse which is supplied by electrical means, to a part of a unit under test (UUT) to be tested, such as a high voltage winding, for example. The voltage impulse has a time duration that is normally in a range up to several tens of microseconds, and, depending on the UUT, the maximum voltage is up to several MV. Determinations regarding the state of the tested component, for example an age or presence of a fault in the electrical insulation, can be derived from continuous measurement of current and/or voltage values within the electrical circuitry of the test layout under the influence of the voltage impulse.

An impulse voltage generator can have a plurality of capacitors, which are charged and connected in parallel. The charged capacitors can be discharged and connected electrically in series to produce a high-voltage impulse. Thus, higher voltages can be achieved through the series connection of the capacitors. The impulse voltage generator has a structure which can be similar to a tower and include a capacitor, a resistor, a spark gap, and insulators, that are combined in a grid structure. The insulators can be in the form of tubes composed of an insulating material, for example glass fiber reinforced plastic (GFRP). The insulators can be arranged one behind the other along a length of the structure, to form a plurality of supporting columns that extend over the entire length of the tower structure. The operation of impulse voltage generators can be limited to a vertical, upright state, as this is the manner in which isolation separations can be maintained from any adjacent ground potential. The highest voltage occurs at the tip of the impulse voltage generator.

High-voltage components such as power transformers can be very heavy, and on the order of several hundred tons, depending on the electrical rating. Transporting a transformer of this size, when installed in an electrical power distribution system to a fixed installed test panel where the transformer can be subjected to an impulse voltage test in the course of servicing or diagnostic testing can be difficult given the high transport cost for the respective transformer. Furthermore, rarely does a power distribution system have sufficient redundancy to allow a transformer to be removed without adversely affecting system operation.

Impulse voltage tests such as those performed on power transformers can be carried out in without transporting the power transformer. The test arrangement that includes the impulse voltage generator and further components such as voltage dividers, and measurement and evaluation apparatuses, can be transported in a plurality of assemblies to the site where the transformer to be tested or to be serviced is located. There, the components and are assembled to form a test arrangement. The voltage divider, which can measure high voltages up to 2 MV, for example, can be a component of considerable size, such as a height of 10 m for example.

On-site assembly of the above-described test arrangement involves a considerable amount of time, in that the positioning and assembly of an impulse voltage generator or of a voltage divider are highly time-consuming.

SUMMARY

An exemplary embodiment is directed to a test arrangement for impulse voltage testing of electrical high-voltage components. The test arrangement includes a cuboid container having first and second container ends, an impulse voltage generator, and a voltage divider. A structure of at least one of the impulse voltage generator and the voltage divider includes a tower having a first and a second structure end. At least one of the impulse voltage generator and the voltage divider can be moved between a first position, which is substantially horizontal, within the cuboid container, and a second position, which is substantially vertical, relative to the container, and wherein movement between the vertical and horizontal positions includes a pivoting movement about a respective rotation axis transversely with respect to the longitudinal direction of the impulse voltage generator.

BRIEF DESCRIPTION OF THE DRAWINGS

The disclosure, further exemplary embodiments and further advantages will be described in more detail with reference to the exemplary embodiments which are illustrated in the drawings, in which.

DETAILED DESCRIPTION

Figure 1:
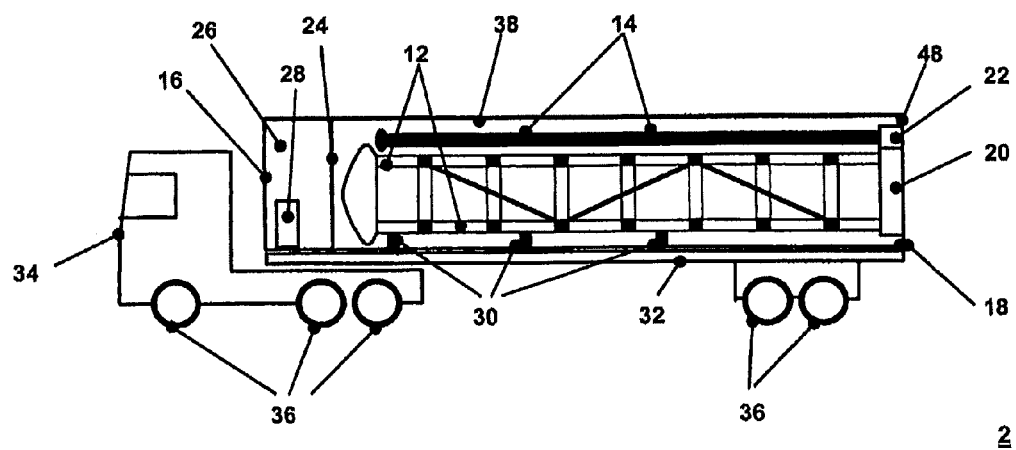
FIG. 1 illustrates a side view of a test arrangement on a transport apparatus with an impulse voltage generator in the horizontal position in accordance with an exemplary embodiment.

The disclosure provides a test arrangement for impulse voltage testing of electrical high-voltage components, which reduces the amount of time required for on-site assembly.

An exemplary test arrangement of the present disclosure includes an impulse voltage generator and/or voltage divider that can be moved between a first position, which can be substantially horizontal, within a cuboid container, and a second position, which can be substantially vertical, relative to the container. A respective movement between the vertical and horizontal positions includes a pivoting movement about a respective rotation axis. The movement acts transversely with respect to the longitudinal direction of the impulse voltage generator.

As a result, the test arrangement can be enclosed within a single container. Transporting can be performed with the impulse voltage generator and the voltage divider in the horizontal position, such a that all major components of the test arrangement are located within the boundary of the container.

Separations can be used during operation to isolate the impulse voltage generator and the voltage divider from grounded components.

The separations can be established through the pivoting movement of the impulse voltage generator and the voltage divider to respective vertical positions. The pivoting movement can be performed after the container has been placed on site in the immediate vicinity of the high-voltage component to be tested, for example at a distance of 5 m to 30 m or other suitable distance as desired.

Given the above exemplary embodiment a complete test arrangement for impulse voltage testing can be transported and operated with little effort.

In a further exemplary test arrangement according to the present disclosure, the container can be connected to a transport apparatus, which has wheels for support. The transport apparatus can be implemented as a goods vehicle, such as a goods vehicle trailer, a semi-trailer, a railroad wagon, or any suitable transport apparatus as desired.

As a result, the test arrangement can be transported by means of conventional vehicles, or other suitable vehicles as desired.

In one exemplary test arrangement of the present disclosure, the container can have an internal area at its first end, that includes measurement apparatuses and/or evaluation apparatuses.

The measurement apparatus can be provided to measure and record a profile of the voltage impulse during an impulse voltage test. During the test, a voltage can be measured and reduced to a low voltage level by means of the voltage divider or other suitable electrical circuit as desired. An evaluation apparatus is provided to evaluate values measured and recorded based on the voltage impulse. The evaluation apparatus evaluates the values and determines a state of the insulation of the tested high-voltage component, for example a power transformer.

All the components of the measurement apparatus, which performs the impulse voltage test can be integrated in the container. This arrangement can reduce the on-site assembly efforts such as wiring efforts for the measurement and evaluation apparatuses.

In a further exemplary test arrangement of the present disclosure, the container can be a transportable freight container that is bounded by walls or wall segments on each of its six sides. The freight container can be a 40-foot freight container or other container of suitable size as desired.

The 40-foot freight container is suitable for transporting the test arrangement by conventional transport facilities, such as a marine vessel, railroad or goods vehicle or other suitable transport facility as desired. The 40 foot length corresponds to one of the largest available lengths of a standard freight container, and is not significantly greater than the length of approximately 10 m required to accommodate an impulse voltage generator and voltage divider. Test arrangements with an impulse voltage generator and voltage divider can have shorter lengths and can therefore be arranged in shorter freight containers.

In one exemplary test arrangement of the present disclosure, the freight container can be licensed in accordance with CSC (Container Safety Convention). This certification allows the freight container to be arranged in any given stacking position when loaded on a container ship. As a result, the transportation of the test arrangement can be further simplified.

In a further exemplary test arrangement of the present disclosure, the impulse voltage generator and the container can be connected to one another at their respective second ends by means of a rotating connection. The rotating connection allows a particularly simple pivoting movement for the impulse voltage generator and/or the voltage divider from a horizontal position to a vertical position. A drive can be provided for performing the pivoting movement.

In a further exemplary test arrangement of the present disclosure, at least one step in the assembly can be initiated by means of remote control as desired. The use of remote control can reduce the assembly effort of the test arrangement and, furthermore, allows an impulse voltage test to be carried out more easily.

According to a further exemplary the test arrangement, the container can be closed on its upper face by at least one movable cover. A continuous cover can protect the test arrangement against external influences, such as rain or dirt, while being transported.

To allow pivoting of the impulse voltage generator and the voltage divider from a horizontal position to a vertical position, an exemplary test arrangement provides a pivot point for each component at an opening on the upper side of the container. The opening results from the cover being moved to a limit position.

The container can be closed by a continuous cover on its upper face during transport. The cover can be opened on site to allow the impulse voltage generator and the voltage divider to be erected in a vertical position. The vertical arrangement of the voltage generator and voltage divider allows the suitable isolation separations to be established for operation of the impulse voltage generator.

In a further exemplary test arrangement, the container can be bounded at least in places by at least one wall or one wall segment at its second end on its two side surfaces. The wall or wall segment can be moved between an open position and a closed position. In the closed position, the sides of the container are closed. In the open position, the side walls are open at the second end of the freight container, and in its rear area, the wall or wall segments are moved in the direction of the first end, or folded up like a door.

Therefore, in the open position, the areas of the side walls of the container which could impede operation of the test arrangement due to a too short isolation separation from the impulse voltage generator, are moved away into an area where the isolation separation is sufficiently great.

In a further exemplary test arrangement, the container can be secured in its respective open position against tilting by means of at least one wall or at least one wall segment.

The container can be secured by pivoting rear side walls about a respective vertical axis on the container wall through 90° in the direction of the front, first end of the container. The width of the container, which governs against possible tilting, is therefore increased by the respective lengths of the pivoted walls or wall segments. Supporting apparatuses can be fitted to the outer ends of the walls or wall segments, which are remote from the rotation axis, and can compensate for any separation between a respective lower edge of the walls or wall segments and the surface on which the apparatus is standing. In the situation when the test arrangement is located on a transport apparatus such as a goods vehicle, a height difference resulting between the container and the standing surface can be compensated for by the supporting apparatuses.

In an exemplary test arrangement, the impulse voltage generator can be connected with a force fit and/or an interlock to the relevant end wall of the second end of the container, and can be pivoted together with the end wall about the rotation axis.

For isolation reasons, the rear end wall of the container can be moved, before operation of the impulse voltage generator, from a vertical transport position to a position which does not adversely affect operation of the impulse voltage generator. When connected to the lower face of the impulse voltage generator, this movement takes place at the same time as the erection of the impulse voltage generator and/or of the voltage divider. The movement of the rear end wall of the container can therefore make it possible to reduce the number of assembly steps.

In one exemplary test arrangement, the voltage divider and the impulse voltage generator can be connected to one another by means of a movement apparatus which can be moved longitudinally and act transversely with respect to the respective parallel longitudinal axes of the voltage divider and impulse voltage generator.

Both the voltage divider and voltage generator can therefore be transported in a space-saving manner, in the horizontal state, with a short parallel distance between them. On site, the voltage divider and impulse voltage generator can be moved to the vertical state together, by means of a single pivoting movement. The parallel distance between the impulse voltage generator and the voltage divider can be increased to a separation distance that achieves isolation during operation, by means of the variable-length movement apparatus.

In a further exemplary test arrangement, the voltage divider can be integrated within a supporting column of the impulse voltage generator. The supporting column can be formed from a plurality of insulating tubes which are arranged one behind the other along the impulse voltage generator structure, which is similar to a tower. This arrangement can reduce the space required for the apparatus.

FIG. 1 illustrates a side view 2 of a test arrangement on a transport apparatus 32, 34 with an impulse voltage generator in the vertical position in accordance with an exemplary embodiment. The test arrangement can be moved on wheels 50, which includes a goods vehicle with a trailer. A cuboid container 16 such as a freight container or other suitable structure as desired can be connected to the trailer 32.

An impulse voltage generator 12 can be arranged in a horizontal position within the container 16. A first base 20 can be connected to the impulse voltage generator 12 at its second end and can be used as a standing surface in a subsequent vertical position of the impulse voltage generator. A voltage divider 14 can be arranged above the impulse voltage generator, and parallel to its longitudinal axis. The two components can be adjacent to one another on a common contact surface, such as the load of the voltage divider 14. In the horizontal position, the load of the voltage divider can be generated by the impulse voltage generator 12, whose load is in turn generated on the surface of the container base, by a plurality of spacers 30.

At its second end, the voltage divider 14 can be connected to a second base 22, which is in turn connected to the first base 20 by means of a telescopic rail (not shown), which cannot be seen in this figure. The two bases 20, 22 can be connected to the rear end wall 48 of the container 16. The impulse voltage generator 12, the voltage divider 14 and the rear end wall 48 can be arranged to pivot about a common rotation axis 18.

An internal area 26, within which measurement and evaluation apparatuses 28 are accommodated, can be separated by means of a partition wall 24 in the front area of the container 16. This measurement room can be used as a working room for the personnel who are carrying out the impulse voltage test.

The upper container face is provided with a cover 38 which is formed from a plurality of individual cover segments. In another exemplary embodiment the cover 38 can be formed from the same material, such as steel or other suitable material as desired, as the side walls of the container.

Figure 2:
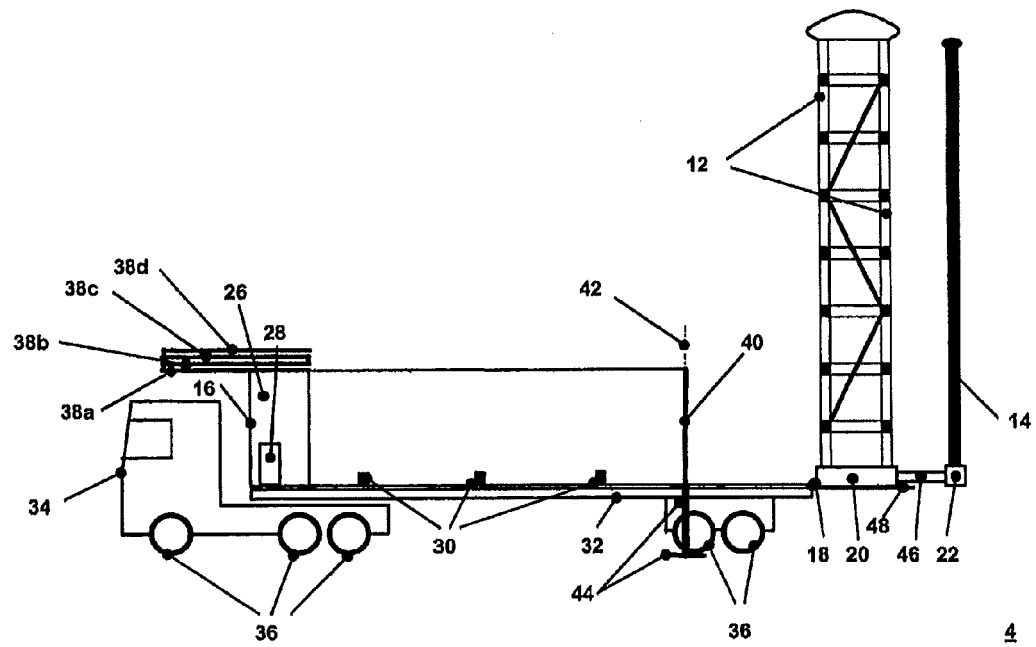
FIG. 2 illustrates a side view of a test arrangement on a transport apparatus with an impulse voltage generator in the vertical position in accordance with an exemplary embodiment.

FIG. 2 illustrates a side view 4 of a test arrangement on a transport apparatus with an impulse voltage generator in the vertical position. The impulse voltage generator 12 and the voltage divider 14 are in a vertical position, which is suitable for carrying out an impulse voltage test.

The distance between the two bases 20, 22, which are adjacent to one another in FIG. 1, can be increased by means of the telescopic rail 46 or other suitable component as desired, which acts between the first base 20 and the second base 22. The impulse voltage generator 12 and the voltage divider 14 can be moved with their longitudinal axes, which run parallel, sufficiently far apart from one another to establish a sufficiently large isolation separation for carrying out an impulse voltage test.

A rear wall segment 40 of a container side can be moved vertically about a folding axis 42 with respect to the rest of the outer container wall. As a result, the rear area of the container side can be free, resulting in a sufficiently large isolation separation from the erected impulse voltage generator 12. A supporting apparatus 44 can be fitted to the outer end of the wall segment 40, to support the wall segment with respect to the standing surface of the trailer 32. A foldable wall segment 40 that includes a supporting apparatus 44 can be provided on both sides of the container 16. The foldable wall segment prevents tilting of the container.

The cover 38, which is illustrated in FIG. 1 in a closed state, can include a plurality of cover segments 38a, 38b, 38c and 38d, which are arranged one above the other, in the area of the front end of the container 16. As a result, the upper face of the container can be opened. A corresponding opening movement includes sliding and folding of the cover segments 38a, 38b, 38c and 38d. The impulse voltage generator 12 and the voltage divider 14 can be pivoted through this opening about the rotation axis 18.

Figure 3:
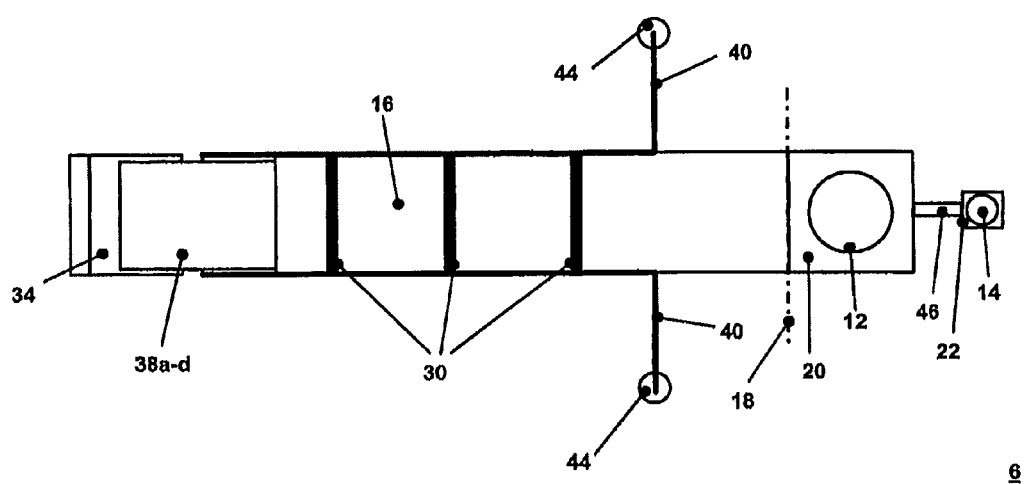
FIG. 3 illustrates a plan view of a test arrangement on a transport apparatus with an impulse voltage generator in the vertical position in accordance with an exemplary embodiment.

FIG. 3 illustrates the plan view of a test arrangement on a transport apparatus with an impulse voltage generator in the vertical position. FIG. 3 shows particularly well the supporting function of the folded-up wall segments 40 with the supporting apparatus 44.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A test arrangement for impulse voltage testing of electrical high-voltage components, comprising:
    a cuboid container having first and second container ends;
    an impulse voltage generator arranged in the container; and
    a voltage divider arranged in the container, wherein a structure of at least one of the impulse voltage generator and the voltage divider includes a tower having a first and a second structure end;

wherein at least one of the impulse voltage generator and the voltage divider can be moved between a first position, which is substantially horizontal, within the cuboid container, and a second position, which is substantially vertical, relative to the container, and wherein movement between the vertical and horizontal positions includes a pivoting movement about a respective rotation axis transversely with respect to the longitudinal direction of the impulse voltage generator.

2. The test arrangement as claimed in claim 1, wherein the container is connected to a transport apparatus, which has wheels for support.

3. The test arrangement as claimed in claim 1, wherein the container has an internal area at its first end, that includes measurement apparatuses and/or evaluation apparatuses.

4. The test arrangement as claimed in claim 1, wherein the container is a transportable freight container that is bounded at least in places by walls or wall segments on each of its six sides.

5. The test arrangement as claimed in claim 4, wherein the freight container is a 40-foot freight container.

6. The test arrangement as claimed in claim 4, wherein the freight container is licensed in accordance with CSC.

7. The test arrangement as claimed in claim 1, wherein the impulse voltage generator and the container are connected through respective second ends by means of a rotating connection.

8. The test arrangement as claimed in claim 1, wherein a drive is provided for carrying out the pivoting movement.

9. The test arrangement as claimed in claim 1, wherein at least one step of the test, can be initiated by means of remote control.

10. The test arrangement as claimed in claim 1, wherein the container can be closed on an upper face by at least one movable cover.

11. The test arrangement as claimed in claim 10, wherein the impulse voltage generator and the voltage divider can be pivoted through an opening on the upper face of the container, wherein the opening results from movement of the cover to a limit position.

12. The test arrangement as claimed in claim 1, wherein the container is in each case bounded by at least one wall or wall segment at its second end on two side surfaces, wherein the at least one wall or wall segment can be moved between an open position and a closed position.

13. The test arrangement as claimed in claim 12, wherein the container is secured against tilting when in an open position by the at least one wall or wall segment.

14. The test arrangement as claimed in claim 1, wherein the impulse voltage generator is connected with at least one of a force fit and/or an interlock to an end wall of the second end of the container, and can be pivoted together with the end wall about the rotation axis.

15. The test arrangement as claimed in claim 1, wherein the voltage divider and the impulse voltage generator are connected through a movement apparatus that can be moved longitudinally and acts transversely with respect to respective parallel longitudinal axes of the voltage divider and the impulse voltage generator.

16. The test arrangement as claimed in claim 1, wherein the voltage divider is integrated within a supporting column of the impulse voltage generator, wherein the supporting column is formed from a plurality of insulating tubes which are arranged one behind the other along the structure.

* * * * *

UNITED STATES PATENT AND TRADEMARK OFFICE
CERTIFICATE OF CORRECTION

PATENT NO. : 8,487,637 B2  
APPLICATION NO. : 12/961988  
DATED : July 16, 2013  
INVENTOR(S) : Peter Werle et al.

Page 1 of 1

It is certified that error appears in the above-identified patent and that said Letters Patent is hereby corrected as shown below:

Title Page, item (73) Assignee change "AGG Technology AG, Zurich (CH)" to --ABB Technology AG, Zurich (CH)--.

Signed and Sealed this
Nineteenth Day of May, 2015

Michelle K. Lee
*Director of the United States Patent and Trademark Office*